(12) United States Patent
Ma

(10) Patent No.: US 6,746,253 B1
(45) Date of Patent: Jun. 8, 2004

(54) LGA SOCKET CONNECTOR WITH DUAL REINFORCING MEMBERS

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/654,287

(22) Filed: Sep. 2, 2003

(30) Foreign Application Priority Data

Jan. 29, 2003 (TW) ....................................... 92201640 U

(51) Int. Cl.⁷ ............................................... H01R 12/00
(52) U.S. Cl. ....................................................... 439/71
(58) Field of Search .......................... 439/71, 66, 525, 439/526, 73, 331

(56) References Cited

U.S. PATENT DOCUMENTS 4,204,722 A * 5/1980 Yasui et al. .................... 439/71
6,210,176 B1 * 4/2001 Hsiao ........................... 439/71
6,375,476 B1 * 4/2002 Goodwin et al. .............. 439/71

* cited by examiner

Primary Examiner—Tho D. Ta
(74) Attorney, Agent, or Firm—Wei Te Chung

(57) ABSTRACT

An LGA socket connector (1) comprises a rectangular base (2), a plurality of terminals (5) received in the base, and two reinforcing members (4) attached to the base. Tow side walls (23) are formed on opposite ends of the base. Each reinforcing member has an elongate base plate (40), a first side plate (42) bent perpendicularly inwardly from a top edge portion of the base plate and a second side plate (44) bent perpendicularly inwardly from a bottom edge portion of the base plate. With this configuration, the reinforcing member is formed from a sheet of metal with very little wastage. Further, the reinforcing members each have a "C"-shaped cross-section. Thus the reinforcing members each can attain a good rigidness along a length thereof. The two reinforcing members are respectively attached to the side walls of the base, thereby the base is effectively reinforced.

4 Claims, 5 Drawing Sheets

LGA SOCKET CONNECTOR WITH DUAL REINFORCING MEMBERS

BACKGROUND OF THE INVENTION

1. Field of the Invention

The present invention relates to an integrated circuit (IC) socket connector, and more particularly to a land grid array (LGA) socket connector with reinforcing members.

2. Description of the Prior Art

With the trend toward miniaturization of electrical components, this enables dielectric components for receiving the electrical components to be correspondingly miniature. Further, the dielectric components are commonly formed from dielectric materials of low rigidity and relatively easily deform. Thus this unexpected deformation decreases reliability of mechanical and electrical engagement between the electrical components.

A typical LGA socket connector is one kind of the miniature electrical and dielectric components. U.S. Pat. No. 6,164,978 discloses an LGA socket connector. Referring to FIG. 4, the LGA socket connector 8 comprises a substantially rectangular base 80, and a plurality of terminals 82 received in the base 80. A rectangular opening 804 is defined in the base 80, for receiving an IC package 7 therein. Four side walls 802 are formed on the base 80, and cooperatively defines the opening 804. A resilient first arm 8040 extends from one side wall 802 into the opening 804. Two spaced resilient second arms 8020 extend from one adjacent side wall 802 into the opening 804.

Referring to FIG. 5, in assembly, when the IC package 7 is placed in the opening 804 of the base 80, the second arms 8020 generate resilient force to hold the IC package 7, and the first arm 8040 only generates relatively little resilient force to facilitate positioning the IC package 7 in the opening 804. Thus the first and second arms 8040, 8020 cooperatively secure the IC package 7 in the opening 804. As a result, mechanical and electrical engagement between the terminals 802 and corresponding pads (not shown) of the IC package 7 is attained.

Referring to FIG. 6, with the second arms 8020 pressing on a side of the IC package 7, a counterforce "F" respectively presses upon two opposite inner sides of side walls 802 of the base 80 in opposite directions. Thus the base 80 is liable to bend along a direction "R". If this happens, some terminals 82 disposed at opposite bending ends of base 80 may not fully engage with the corresponding pads of the IC package 7. Uniform engagement between the terminals 82 and the corresponding pads of the IC package 7 is destroyed, and even open electrical circuits are formed therebetween. Thus reliability of mechanical and electrical engagement between the terminals 82 and the corresponding pads of the IC package 7 is decreased.

FIG. 7 discloses another kind of typical LGA socket connector 9, which comprises a base 90, a plurality of terminals (not shown) received in the base 90, a cover 92 pivotally attached to the base 90, an actuator member 93 rotatably mounted on the base 90, and a retention frame 91 mounted on the base 90. The actuator member 93 is disposed at one end of the base 90, and the cover 92 is pivoted at an opposite end of the base 90. With this structure, in use, a position portion (not labeled) of the actuator member 93 is adopted to resiliently press an extending portion (not labeled) of the cover 92 so as to position the cover 92 on the base 90. Thus mechanical and electrical engagement between the terminals and corresponding pads of an IC package (not shown) is attained. By this positioning means, the base 90 has a trend of warping upwardly at said opposite ends thereof.

The retention frame 91 is formed from a sheet of metal material, and has a good rigidity. With the retention frame 91 being mounted on the base 90, the rigid retention frame 91 prevents the base 90 from warping upwardly at said opposite ends thereof. Thus reliable engagement between the terminals and the corresponding pads of the IC package is assured.

In essence, the base 90 has a trend of warping upwardly only at said opposite ends thereof. Thus only two opposite laterals (not labeled) of the retention frame 91 are used to prevent the base 90 from warping upwardly at he opposite ends thereof. However, the retention frame 91 has four sides. The four sides cooperatively define an opening (not labeled). With this structure, when the retention frame 91 is formed from the sheet of metal material, much metal material may be wasted, this inflates manufacturing costs of the retention frame 91.

Accordingly, there is a need to provide an improved LGA socket connector to overcome the above-mentioned problems.

SUMMARY OF THE INVENTION

Accordingly, a main object of the present invention is to provide an LGA socket connector with two reinforcing members able to both reinforce a base of the socket connector and lower manufacturing costs thereof. thereof.

To fulfill the above-mentioned object, an LGA socket connector comprises a rectangular base, a plurality of terminals received in the base, and two reinforcing members attached to the base. Tow side walls are defined on opposite ends of the base. Each reinforcing member has an elongate base plate, a first side plate bent perpendicularly inwardly from a top edge portion of the base plate and a second side plate bent perpendicularly inwardly from a bottom edge portion of the base plate. With this configuration, the reinforcing member is formed from a sheet of metal with very little wastage. Further, the reinforcing member has a "C"-shaped cross-section. Thus said reinforcing member can attain a good rigidity along a length thereof. The two reinforcing members are respectively attached to said side walls, the base is thereby effectively reinforced.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
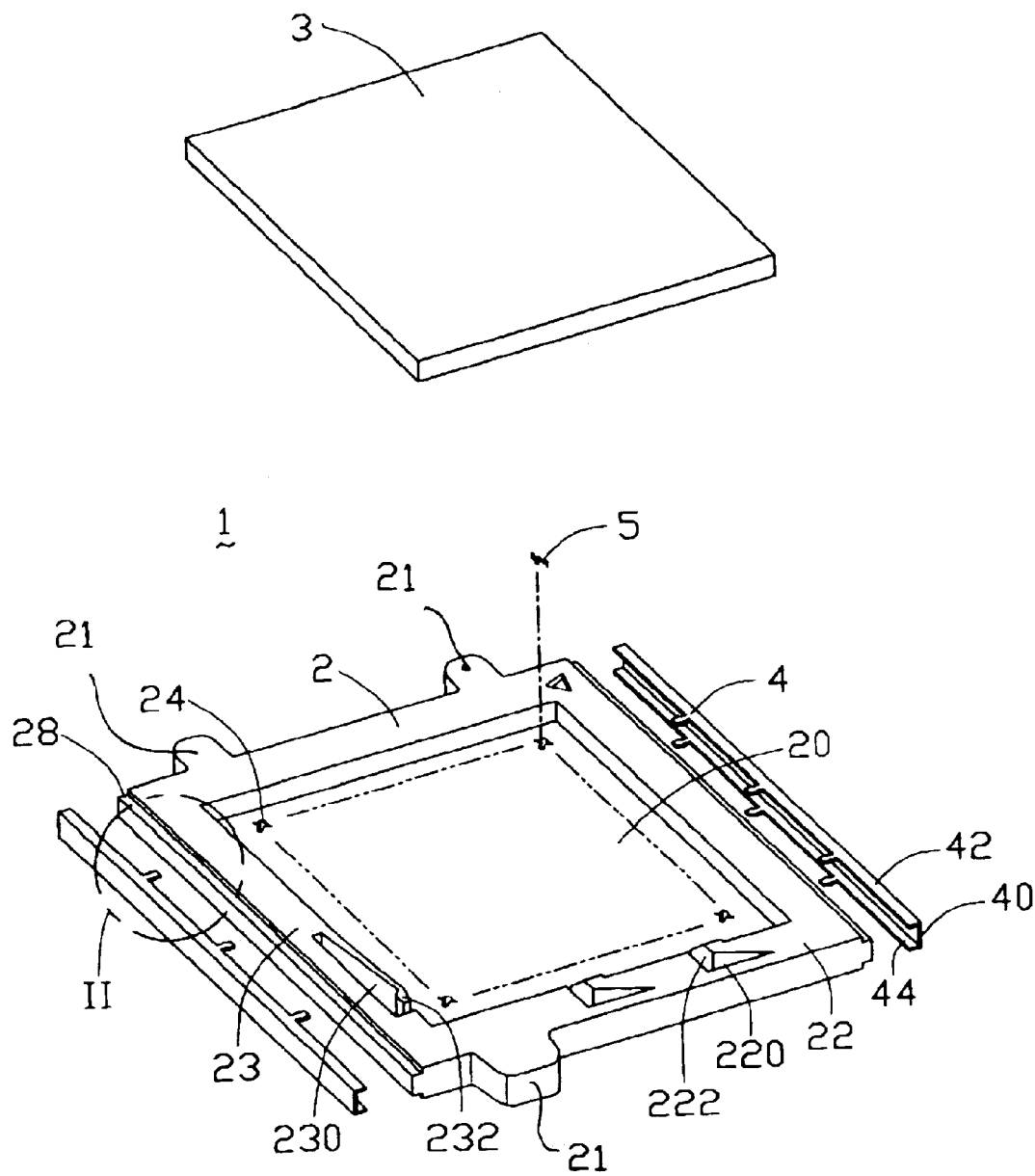
FIG. 1 is an exploded, isometric view of an LGA socket connector according to the present invention, together with an IC package ready to be mounted in a base of the LGA socket connector.

FIG. 1 shows an LGA socket connector 1 according to a preferred embodiment of the present invention is for electrically interconnecting an IC package 3 with a circuit substrate such as a PCB (not shown). The connector 1 comprises a substantially rectangular dielectric base 2, a plurality of terminals 5 (only one shown) received in the base 2, and two metal reinforcing members 4 attached to the base 2.

The base 2 defines a rectangular array of passages 24 therein, for receiving corresponding terminals 5 therein. The base 2 comprises first and second pairs of parallel side walls 22, 23 around a periphery thereof, the side walls 22, 23 cooperatively defining a rectangular opening 20 therebetween for receiving the IC package 3 therein. The side walls 22 further define positioning protrusions 21 thereon on the exterior faces. Two spaced L-shaped first cutouts 220 are defined in an inner periphery of one of the side walls 22. A pair of spaced first spring arms 222 is thus formed in the inner periphery of said side wall 22 at the first cutouts 220 respectively, the first spring arms 222 protruding slightly into the opening 20. An L-shaped second cutout 230 is defined in an inner periphery of one of the side walls 23. A second spring arm 232 is thus formed in the inner periphery of said side wall 22 at the second cutout 230, the second spring arm 232 protruding slightly into the opening 20. The first spring arms 222 have a same configuration, and each first spring arm 222 has a cross-section larger than that of the second spring arm 232.

Figure 2:
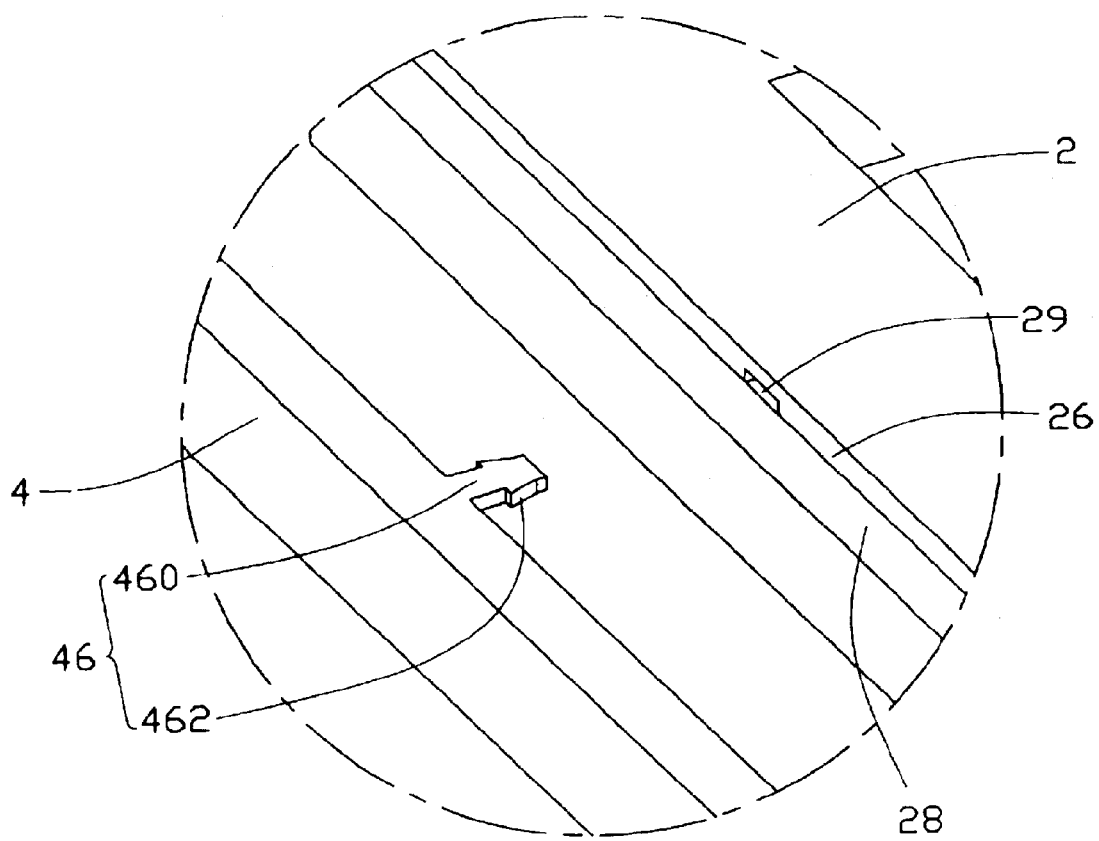
FIG. 2 is an enlarged view of a circled portion II of FIG. 1.
Figure 3:
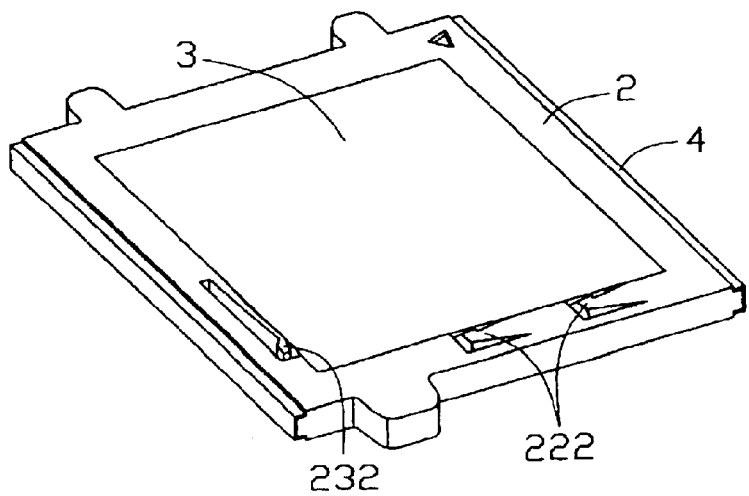
FIG. 3 is an assembled view of FIG. 1.
Figure 4:
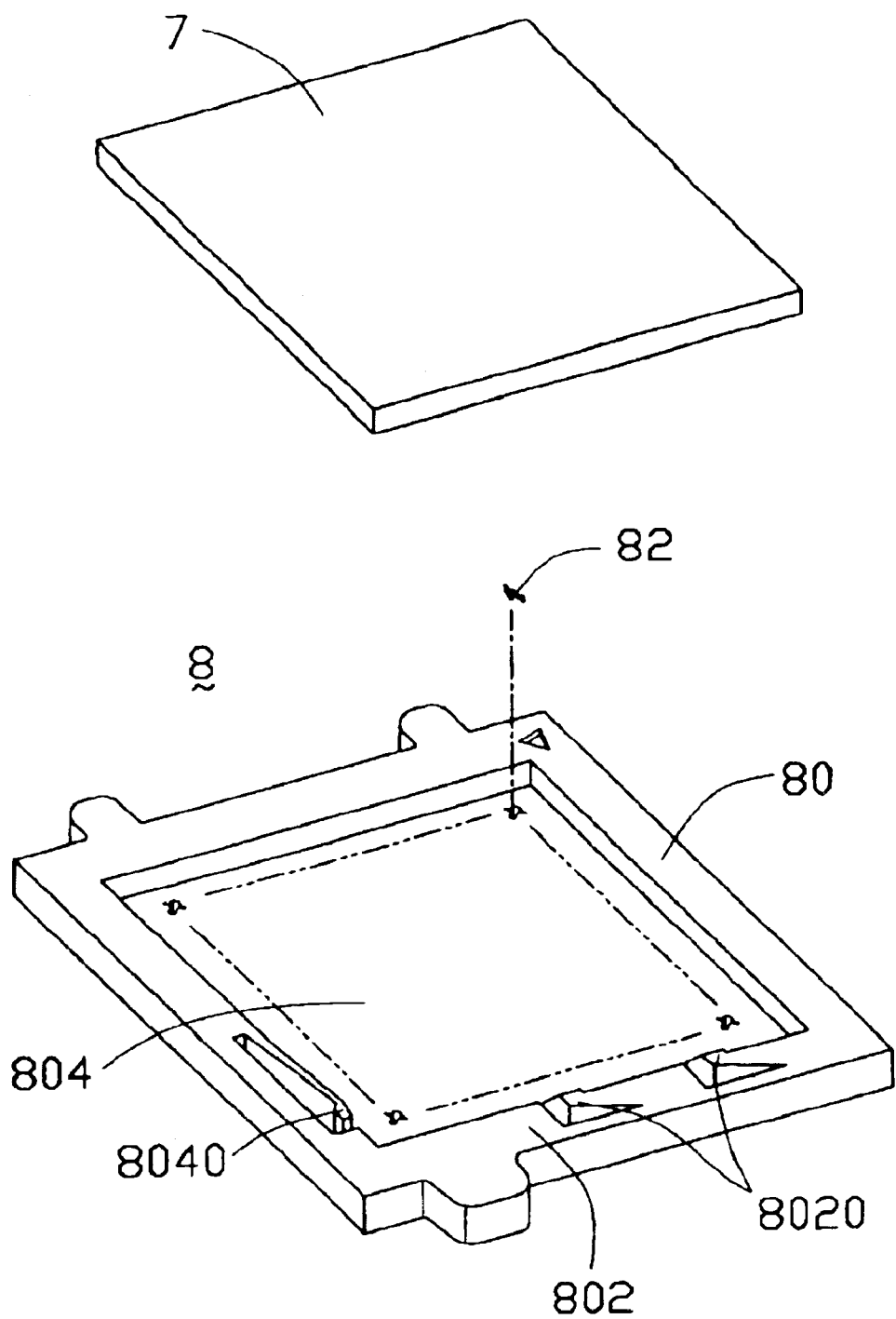
FIG. 4 is an exploded, isometric view of a conventional LGA socket connector, together with an IC package ready to be mounted in a base of the LGA socket connector.
Figure 5:
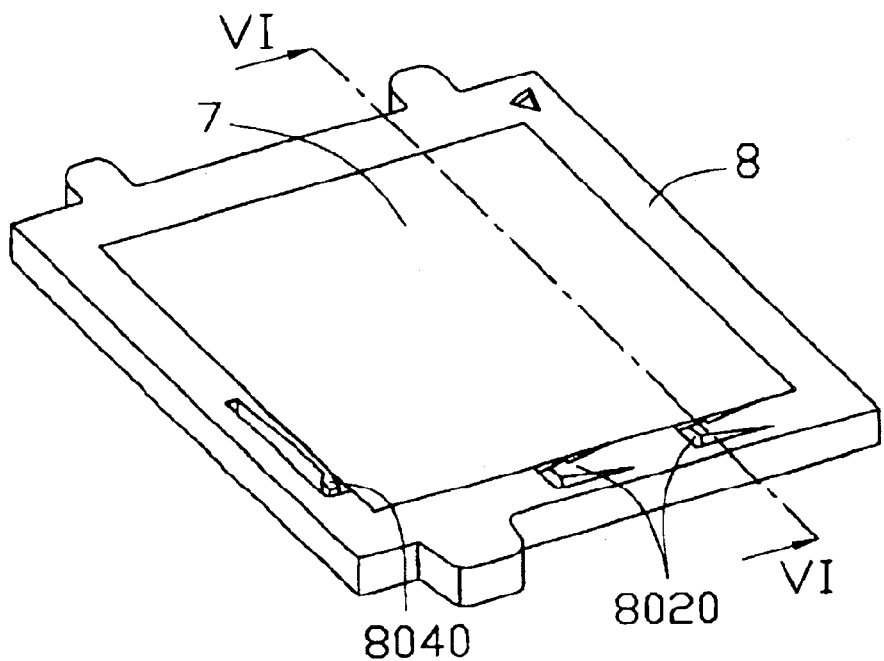
FIG. 5 is an assembled view of FIG. 4.
Figure 6:
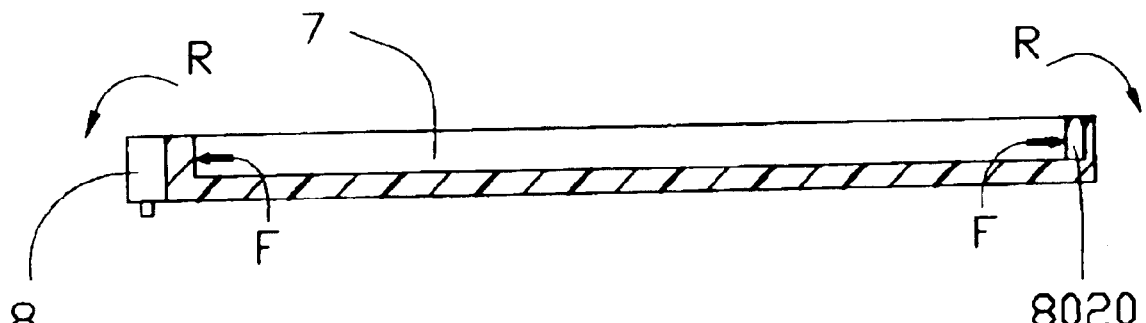
FIG. 6 is a cross-section view along a line VI—VI of FIG. 5.
Figure 7:
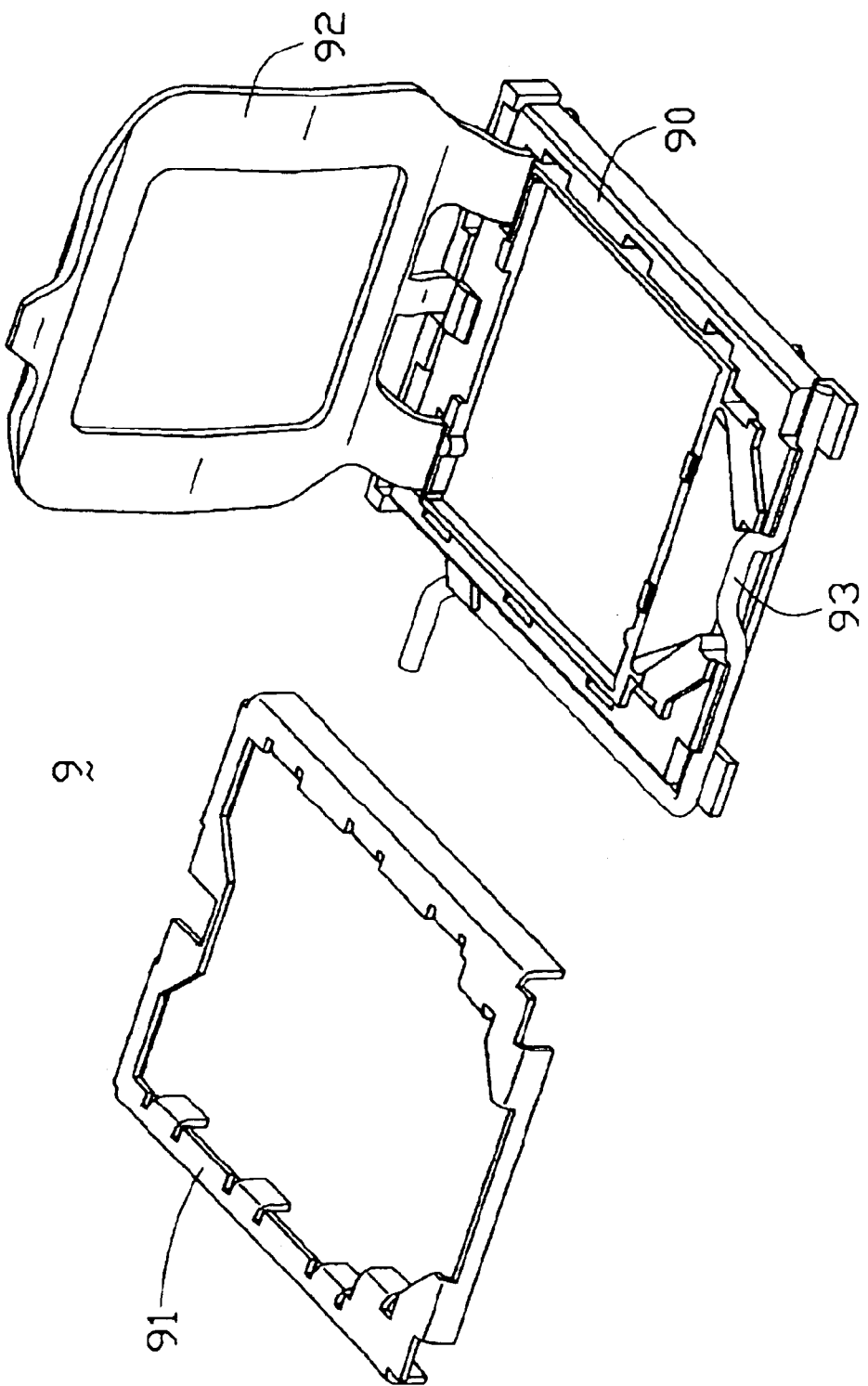
FIG. 7 is an isometric view of another conventional LAG socket connector, with a retention frame of the LGA socket connector being exploded.

Referring also to FIG. 2, two parallel side surfaces 26 are defined on outsides of the side walls 23 respectively. An elongate extending portion 28 extends perpendicularly outwardly from each side surface 26. The extending portion 28 has a rectangular cross-section. Three pairs of positioning holes 29 are defined in each side surface 26, each pair of positioning holes 29 being symmetrically arranged at opposite sides of the extending portion 28 respectively.

The base 2 symmetrically forms a plurality of posts (not shown) on a bottom thereof, for being receiving in corresponding holes (not shown) of the PCB.

Each reinforcing member 4 is formed from a sheet of rigid metal. This gives the reinforcing member 4 high rigidity. Each reinforcing member 4 comprises an elongate base plate 40. An elongate first side plate 42 is bent perpendicularly inwardly from a top edge portion of the base plate 40. An elongate second side plate 44 is bent perpendicularly inwardly from a bottom edge portion of the base plate 40. Thus the reinforcing member 4 has a generally "C"-shaped cross-section. This provides the reinforcing member 4 with even more rigidity along a length thereof. Further, the base plate 40 and the first and second side plates 42, 44 cooperatively define a space therebetween for receiving a corresponding extending portion 28 of the base 2. With this configuration, the reinforcing member 4 can be manufactured from a sheet of metal with very little wastage. This reduces manufacturing costs of the reinforcing members 4.

Three position portions 46 extend coplanarly inwardly from a longitudinal lateral edge of each of the first and second side plates 42, 44. Each positioning portion 46 comprises a protruding portion 460. A barb 462 is formed on each of opposite sides of the protruding portion 460, for interferingly engaging in a corresponding positioning hole 29 of the base 2.

In assembly of the connector 1, the terminals 5 are secured in the corresponding passages 24 of the base 2. The reinforcing members 4 are attached to the corresponding side surfaces 26 of the base 2, with the barbs 462 of the positioning portions 46 of the reinforcing members 4 being interferingly engaged in the corresponding positioning holes 29. Simultaneously, the extending portions 28 of the base 2 are received in said spaces of the reinforcing members 4. Thus the reinforcing members 4 are firmly attached on the base 2.

In use, the connector 1 is pre-positioned on the PCB, with the posts of the connector 1 being received in the holes of the PCB. The connector 1 is mounted on the PCB by using surface mount technology (SMT) or suitable mechanical tools.

During insertion of the IC package 3 in the opening 20 of the base 2, corresponding lateral sides (not labeled) of the IC package 3 press the first and second spring arms 222, 232. The first spring and second arms 222, 232 resiliently deform and generate required resilient force, thereby cooperatively securing the IC package 3 in the opening 20.

Because the first spring arms 222 each have a cross-section larger than that of the second spring arm 232, the first spring arms 222 exert relatively large resilient forces to hold the IC package 3, and the second spring arm 232 is adapted to facilitate positioning of the IC package 3 in the opening 20. Consequently, the resilient forces of the first spring arms 222 cause a trend of bending the base 2 along lengths of the side walls 23.

Nevertheless, the reinforcing members 4 are attached on the side walls 23. Because the reinforcing members 4 each have the "C"-shaped cross-section, the reinforcing members 4 effectively prevent bending along the lengths of the side walls 23. The base 2 resists bending, and reliability of mechanical and electrical engagement between the IC package 3 and the PCB is enhanced.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A land grid array (LGA) socket connector for electrically interconnecting an integrated circuit (IC) package with a circuit substrate, the LGA socket connector comprising:

a substantially rectangular dielectric base defining a plurality of passages and four side walls, the side walls cooperatively defining an opening therebetween for receiving the IC package;

a plurality of terminals each received in a corresponding passage for engaging with the IC package and the circuit substrate; and two reinforcing members respectively attached to opposite two of the side walls for reinforcing the base along longitudinal directions of the opposite two of the side walls, the reinforcing members each having an elongate base plate and at least one side plate substantially perpendicularly bent from at least one of opposite longitudinal sides of the base plate;

wherein the opposite two of the side walls each defines a side surface;

wherein the base portion forms an extending portion on said each side surface;

wherein the base defines positioning holes in said each side surface, the positioning holes being symmetrically arranged at opposite sides of the corresponding extending portions;

wherein the at least one side plate forms positioning portions at a longitudinal side thereof, the positioning portions corresponding to respective positioning holes of the base;

wherein the positioning portions each have a protruding portion, the protruding portion outwardly defining at least one barb at each of opposite sides thereof for interferingly engaging in said corresponding positioning hole;

wherein the reinforcing members each have a generally "C"-shaped cross-section.

2. The electrical connector of claim 1, wherein one side wall forms a pair of first spring arms.

3. The electrical connector of claim 2, wherein one adjacent side wall forms a second spring arm.

4. The electrical connector of claim 3, wherein the first and second spring arms protrude into the opening.

\* \* \* \* \*